(12) United States Patent
Tadokoro et al.

(10) Patent No.: US 6,365,894 B2
(45) Date of Patent: Apr. 2, 2002

(54) ELECTROMAGNET AND MAGNETIC FIELD GENERATING APPARATUS

(75) Inventors: Masahiro Tadokoro, Hitachioota; Junichi Hirota, Hitachi; Kazuo Hiramoto, Hitachioota; Masumi Umezawa, Hitachi; Yoshihisa Iwashita, 5-79, Higashihayaagari, Todou, Uji-shi, Kyoto 611-0013, all of (JP)

(73) Assignees: Hitachi, Ltd., Tokyo; Yoshihisa Iwashita, Kyoto, both of (JP)

( * ) Notice: Subject to any disclaimer, the term of this patent is extended or adjusted under 35 U.S.C. 154(b) by 0 days.

(21) Appl. No.: 09/810,589

(22) Filed: Mar. 19, 2001

Related U.S. Application Data (62) Division of application No. 09/070,934, filed on May 1, 1998, now Pat. No. 6,236,043.

(30) Foreign Application Priority Data

May 9, 1997 (JP) ............................................. 9-119057
Mar. 11, 1998 (JP) ............................................. 10-59256

(51) Int. Cl.[7] ............................................. H01J 37/147
(52) U.S. Cl. ................ 250/298; 250/294; 250/396 ML; 315/503; 335/212
(58) Field of Search ................................ 250/298, 294, 250/396 ML; 315/503; 335/212

(56) References Cited

U.S. PATENT DOCUMENTS 3,629,578 A * 12/1971 Le Poole ................ 250/49.5 D
5,568,109 A * 10/1996 Takayama .................... 335/213

FOREIGN PATENT DOCUMENTS

| JP | 58-74800 | 5/1983 |
| JP | 3-82600 | 8/1991 |
| JP | 5-47547 | 2/1993 |
| JP | 5-243037 | 9/1993 |

* cited by examiner

*Primary Examiner*—Teresa M. Arroyo
*Assistant Examiner*—Nikita Wells
(74) *Attorney, Agent, or Firm*—Mattingly, Stanger & Malur, P.C.

(57) ABSTRACT

An electromagnet comprises a pair of magnetic pole 1a and 1b, a return yoke 3, exciting coils 4 and 5, etc. In an interior portion of a magnetic pole, plural spacers 2a–2g are provided putting side by side in a horizontal direction. Each of the spaces 2a–2g is an air layer and a longitudinal cross-section is a substantially rectangular shape and the space has a lengthily extending slit shape in a vertical direction against a paper face in FIG. 1. The plural spaces are mainly arranged toward a right side from a beam orbit center O and an interval formed between adjacent spaces is narrower toward the right side. The electromagnet having a simple magnetic pole structure and a wide effective magnetic field area in a case where a maximum magnetic field strength is increased can be secured.

6 Claims, 8 Drawing Sheets

ELECTROMAGNET AND MAGNETIC FIELD GENERATING APPARATUS

This application is a divisional application of U.S. application Ser. No. 09/070,934, filed May 1, 1998, now U.S. Pat. No. 6,236,043B1.

BACKGROUND OF THE INVENTION

1. Technical Field

The present invention relates to an electromagnet for bending an orbit of a charged particle beam and a magnetic field generating apparatus for generating a magnetic field in an air gap and, in particular to an electromagnet suitable for use in a physics experimentation accelerator, an industrial accelerator and a medical treatment accelerator or a magnetic field generating apparatus for use in a medical treatment diagnostic instrument such as MRI (Magnetic Resonance Imager).

2. Prior Arts

In general, an electromagnet used in an accelerator is designed to have a desirable magnetic field distribution in a predetermined area which is determined by the size of a charged particle beam (hereinafter, a beam). However, in a case when a magnetic field strength increases, due to the effect of magnetic saturation of the iron core which is used in the magnetic pole of the electromagnet, the leakage magnetic field from the magnetic pole increases. According to the effect of this leakage magnetic field, since an area (hereinafter, a preferable magnetic field area) becomes narrow, where an amount of displacement from a desirable magnetic field distribution is less than a predetermined value, the electromagnet's maximum magnetic field strength that is actually useable is limited.

For example, for a bending electromagnet used in an accelerator, when a radius of curvature and a maximum magnetic field strength are determined, a maximum energy of the beam obtained by the accelerator is determined. As a result, when a beam with a wide energy range is sought, since the maximum magnetic field strength of the electromagnet is limited for the above stated reasons, it is necessary to employ a bending electromagnet having a large radius of curvature.

As to the prior art, a bending electromagnet is disclosed in Japanese patent laid-open publication No. Hei 5-47, 547 (hereinafter first prior art). In such a bending electromagnet, a projection which is a magnetic pole shim is provided at an end portion of the magnetic poles which are arranged oppositely.

Further, recently attention has been paid to a medical treatment use diagnosing instrument using a magnetic field such as an open type MRI, in which a permanent magnet having a flexibility is utilized, and also about a method for generating a high magnetic field and a good uniformity magnetic field in an air gap.

In the magnetic field generating apparatus having a permanent magnet, a conventional technique for generating the magnetic field having a high magnetic field and the good uniformity is disclosed in Japanese patent laid-open publication No. Hei 5-243,037 (hereinafter, the second prior art). This magnetic field generating apparatus comprises pole pieces which are arranged oppositely and at an end portion a magnetic pole shim is provided, and permanent magnets.

Figure 12:
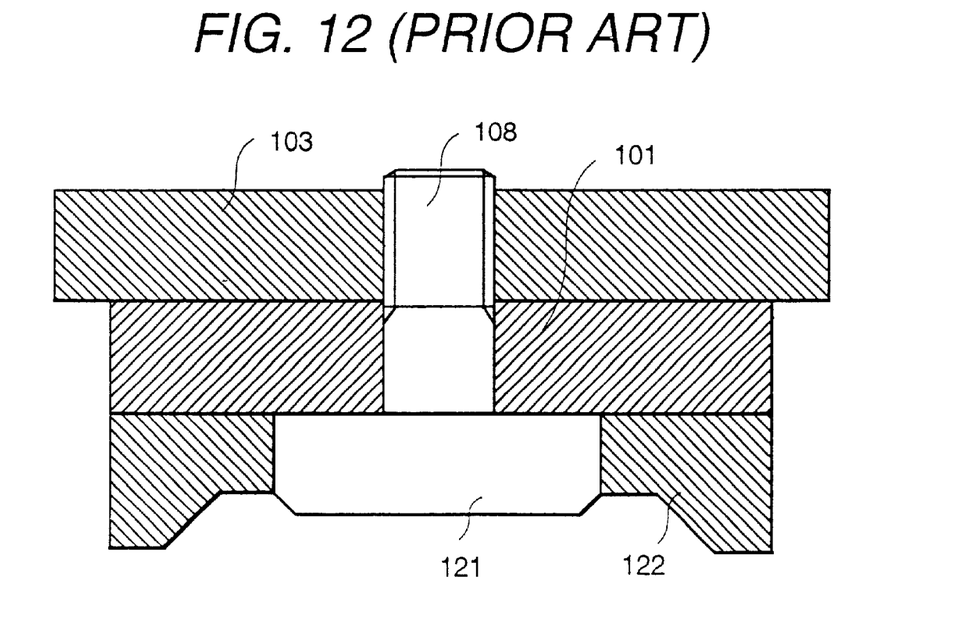
FIG. 12 is a lateral cross-sectional view showing an upper portion magnetic pole portion of a magnetic field generating apparatus according to the prior art.

Further, this magnetic field apparatus has a central portion of the pole piece which is moved toward an upper portion and a lower portion. A lateral cross-section of an upper portion magnetic pole portion in this magnetic field generating apparatus is shown in FIG. 12. In FIG. 12, 101 denotes a permanent magnet, 103 denotes a yoke, 108 denotes a permanent magnet fixing use bolt, and 121 and 122 denote pole pieces.

In the above stated first prior art, by concentrating a line of magnetic force which spreads from an end portion of the magnetic pole toward a lateral direction, it aims to spread a good field region (stated in a latter portion) formed between the magnetic poles.

However, since it is necessary to provide the projection to the magnetic pole, a magnetic pole structure becomes a complicated one. Further, since the magnetic field distribution formed between the magnetic poles is affected largely by a shape of the projection, high processing accuracy for manufacturing the magnetic poles is required. Also, a manufacturing cost becomes high.

Further, in the above stated second prior art, similarly to the first prior art, since it is necessary to provide the projection to the pole piece, the pole piece structure becomes a complicated one. Further, since the magnetic field distribution formed between the pole pieces is affected largely by a shape of the projection, high processing accuracy for the pole pieces is required.

Further, in the second prior art, since a movement mechanism is provided, a large mechanical force is applied to a mechanical sliding portion, and a high reliability, and a high reproducibility are required. Also, a manufacturing cost becomes high.

On the other hand, in the deflecting electromagnet in which a projection is not provided to a magnetic pole, since a maximum magnetic field strength is limited according to the affect of magnetic saturation, in a case where a beam with a wide energy range is sought, the bending electromagnet becomes a large size one and also the accelerator becomes a large size one. Similarly too, the magnetic field generating apparatus in which the projection is not provided at the pole piece becomes a large size one.

SUMMARY OF THE INVENTION

A first object according to the present invention is to provide an electromagnet which has a simple structure and secures a high magnetic field and a good uniformity magnetic field or a magnetic field generating apparatus. Herein, the good magnetic field having the uniformity property indicates that the effective magnetic field area is wide. Further, the effective magnetic field area is one which can be used for bending an orbit of a beam in a preferable magnetic field area.

A second object according to the present invention is to provide an accelerator which has a wide beam energy range and a small size structure.

A first embodiment for attaining the first object is an electromagnet for bending an orbit of a charged particle beam according to a magnetic field which is generated between magnetic poles, said magnetic pole having at an interior portion thereof an area which has a lower relative permeability than that of a magnetic pole forming material.

A second embodiment for attaining the first object is an electromagnet that comprises at least one pair of magnetic poles which are arranged oppositely, a return yoke for forming a magnetic path by connecting said magnetic poles to each other, and a coil for generating a magnetic field to vary an orbit of a charged particle beam in a space formed between said magnetic poles, said magnetic pole having a space at an interior portion thereof.

A third embodiment for attaining the first object is an electromagnet that comprises at least one pair of magnetic poles which are arranged oppositely, a return yoke for forming a magnetic path by connecting said magnetic poles each other, and a coil for generating a magnetic field in a space to vary an orbit of a charged particle beam between said magnetic poles, a space being provided at an interior portion of said magnetic pole to form substantially homogeneously a magnetic field strength at a predetermined area formed between said magnetic poles.

A fourth embodiment for attaining the second object is an accelerator that comprises a first half accelerator for generating a charged particle beam, a synchrotron for increasing an energy by accelerating said charged particle beam, and a beam transportation system which injects said charged particle beam extracted from said first half accelerator to said synchrotron, said synchrotron having an electromagnet with an area having a lower relative permeability than that of a magnetic pole forming material is provided.

A fifth embodiment for attaining the second object is an accelerator that comprises a first half accelerator for generating a charged particle beam, a synchrotron for increasing an energy by accelerating said charged particle beam, and a beam transportation system which injects said charged particle beam extracted from said first half accelerator to said synchrotron, said synchrotron having an electromagnet in which a space is provided at an interior portion of a magnetic pole to form substantially homogeneously a magnetic field strength at a predetermined area formed between said magnetic poles.

A sixth embodiment for attaining the first object is a magnetic field generating apparatus that comprises at least one pair of pole pieces which are arranged oppositely by forming an air gap, and a permanent magnet for supplying a magnetic flux to said pole piece, said pole piece having at an interior portion thereof an area which has a lower relative permeability than that of a pole piece forming material.

DESCRIPTION OF THE INVENTION

First Embodiment

Figure 1:
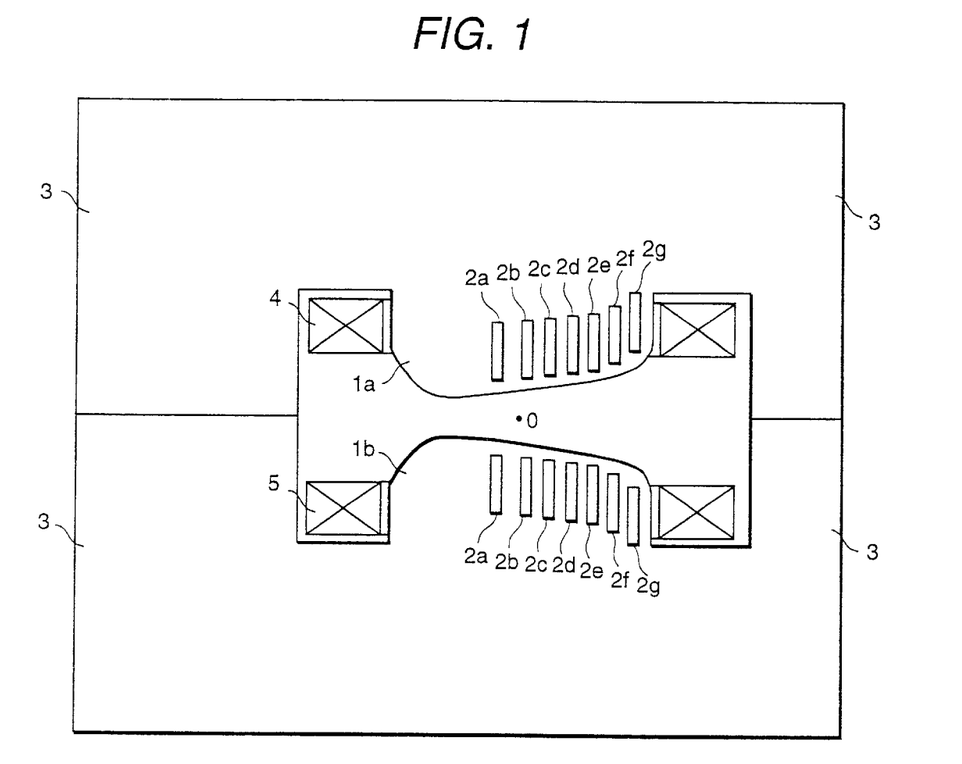
FIG. 1 is a longitudinal cross-sectional view showing a first embodiment of an electromagnet according to the present invention.

Hereinafter, a first embodiment of an electromagnet according to the present invention will be explained referring to FIG. 1. FIG. 1 is a longitudinal cross-sectional view showing a combined function bending magnet to which the present invention is applied. This electromagnet has both functions of a being electromagnet (a two-pole electromagnet) and a quandrupole electromagnet and it is assumed that the electromagnet is provided on an orbit of an orbital charged beam.

This electromagnet is constituted by a pair of magnetic pole $1a$ and magnetic pole $1b$ which are arranged oppositely by sandwiching the orbit of the beam, a return yoke 3 for forming a magnetic path by connecting the magnetic pole $1a$ and the magnetic pole $1b$, and exciting coils 4 and 5, etc.

In an interior portion of each of the magnetic pole $1a$ and the magnetic pole $1b$, plural spaces $2a$–$2g$ are provided side by side in a horizontal direction (a lateral direction in FIG. 1). This electromagnet is constituted symmetrically with an upper and lower portion being symmetrical with respect to a horizontal plane (hereinafter, it is called as an orbit horizontal plane) including a center O of the beam orbit.

The return yoke 3 is divided into an upper side portion and a lower side portion on the orbit horizontal plane. An upper side return yoke 3 and the magnetic pole $1a$ constitute an upper portion magnetic core as one body and further a lower side return yoke 3 and the magnetic pole $1b$ constitute a lower portion magnetic core as one body. The upper portion magnetic core and the lower portion magnetic core are constituted respectively by laminating thin plate shaped electromagnetic steel plates that are combined with each other on the orbit plane.

A surface for opposing the magnetic pole $1a$ and the magnetic pole $1b$ is constituted to have a different magnetic pole (N pole or S pole) each other. For example, in a case where a surface of the magnetic pole $1a$ is N pole, so as to form a surface of the magnetic pole $1b$ as S pole, an electric current direction for flowing into the exciting poles 4 and 5 is adjusted.

An interval in a vertical direction (an upper and lower direction in FIG. 1) between the magnetic pole $1a$ and the magnetic pole $1b$ is constituted to form wider toward a right side. Employing the magnetic poles with the above stated construction, the electric current is forced to flow into the exciting coils 4 and 5. Accordingly, the magnetic field having a bending magnetic field component and a quandrupole magnetic field component can be generated in an area which includes the beam orbit between the magnetic poles.

The respective interior portion of the spaces $2a$–$2g$ is an air layer and forms a lower relative permeability area than that of the magnetic pole forming material. The respective spaces $2a$–$2g$ have a similar shape. The longitudinal cross-section is substantially rectangular in shape and has a slit like shape which extends lengthwise toward a vertical direction with respect to the face of the paper on which FIG. 1 is shown.

The plural spaces $2a$–$2g$ are arranged mainly near an area to the surface of the magnetic pole toward the right side from the center O of the beam orbit and an interval of the adjacent spaces is formed narrower toward the right side. In this case, a right side direction corresponds to an outer side direction of the circulating beam orbit and a left side direction corresponds to an inner side direction of the circulating beam orbit, respectively.

Figure 2:
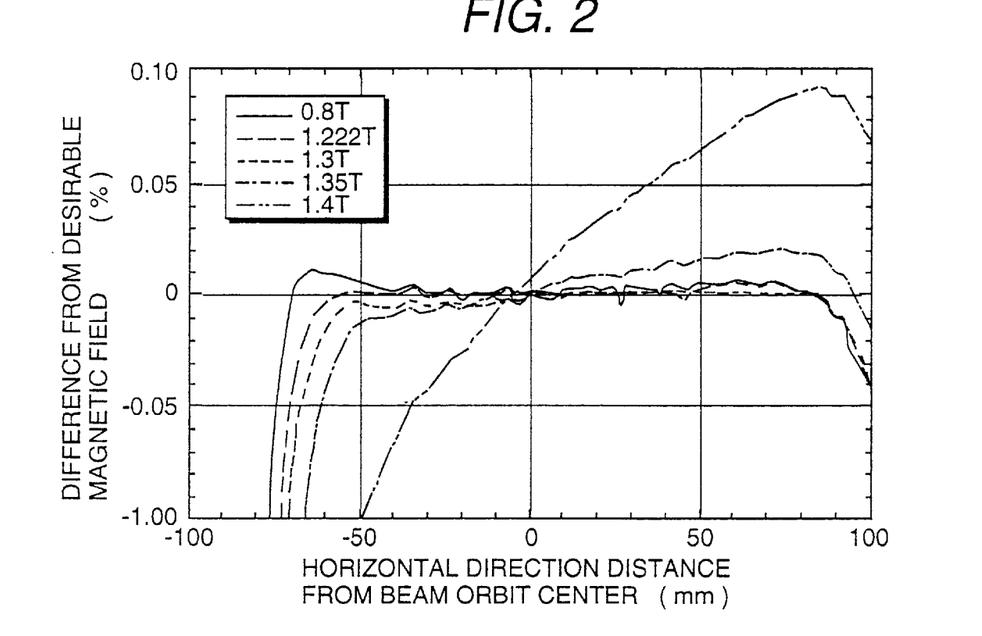
FIG. 2 is an analysis example showing a magnetic field distribution according to the first embodiment.

An improvement effect of the magnetic field distribution of the above stated first embodiment according to the present invention will be explained referring to FIG. 2 and FIG. 3. FIG. 2 shows an analysis example of the magnetic field distribution according to the first embodiment and FIG. 3 shows an analysis example of a magnetic field distribution according to a first comparison example where the spaces shown in FIG. 1 do not exist.

Figure 3:
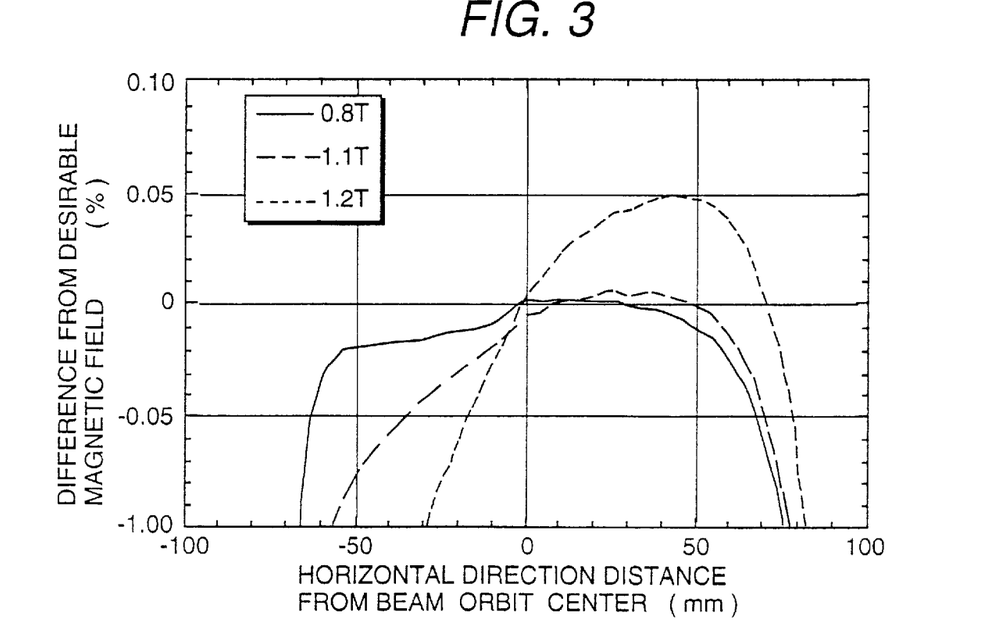
FIG. 3 is an analysis example showing a magnetic field distribution according to a first comparison example.

In both of FIG. 2 and FIG. 3, a horizontal axis expresses a horizontal direction distance from the beam orbit center O on the orbit horizontal plane face in FIG. 1 and a vertical axis expresses a relative value in which a difference between a required desirable magnetic field strength in the electromagnet shown in FIG. 1 is standardized using a desirable magnetic field strength.

Figure 4:
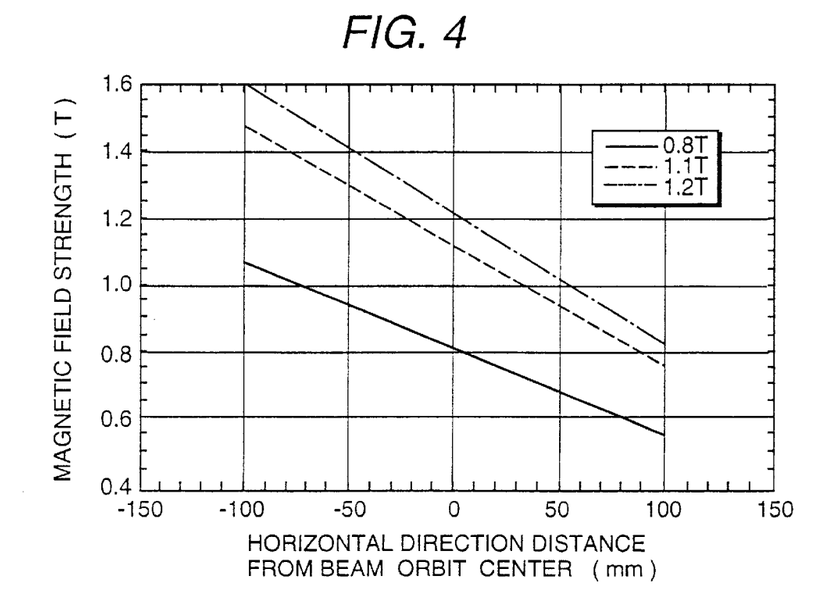
FIG. 4 is a desirable magnetic field strength according to the first embodiment.

Herein, the desirable magnetic field strength indicates a magnetic field strength shown in FIG. 4. In other words, the desirable magnetic field strength reduces monotonously in as the horizontal direction distance from the beam orbit center O becomes large. In FIG. 4, a real line, a dot line and an one-dot chain line shows a respective magnetic field strength on the beam orbit center O (hereinafter, it is called as a center magnetic field strength) in cases of 0.8 T, 1.1 T and 1.2 T, respectively.

In the cases of FIG. 2 and FIG. 3, for example, +50 mm in the horizontal axis corresponds to a position separated from 50 mm toward the right side from the beam orbit center O and further +0.05% in the vertical axis corresponds to a generation of the magnetic field strength which has 0.05% stronger magnetic field strength than the desirable magnetic In a case where the space does not exist in the magnetic pole, as shown in FIG. 3, as far as the center magnetic field strength $B_0$ is 0.8 T, with a range of the horizontal direction distance between −50 mm−+50 mm, the difference between the desirable magnetic field having less than about ±0.02% can be attained.

Namely, the preferable magnetic field area is an area of the horizontal direction distance between −50 mm−+50 mm. Hereinafter, a right end and a left end of the preferable magnetic field area, an area which is defined by a shorter distance from the beam orbit center O is called as an effective magnetic field area in the present specification.

For example, in the above stated example, since an upper limit of the preferable magnetic field area is +55 mm and a lower limit of the preferable magnetic field area is −50 mm, the shorter distance from the beam orbit center is −50 mm. In this case, the area having the horizontal direction distance of ±50 mm is called as the effective magnetic field.

Since the beam orbits by vibrating the beam orbit center O as a center, the effective magnetic field area is a magnetic field area which can be utilized to vary the orbit of the beam. Hereinafter, the effective magnetic field area is expressed using Le. 50 mm; at $B_0$=1.1 T, Le is about ±10 mm; and at $B_0$=1.2 T, Le is about ±5 mm. Namely, between the center magnetic field strength between from 0.8 T to 1.1 T, the effective magnetic field area Le reduces abruptly.

In comparison with the above case shown in FIG. 3, as shown in FIG. 2, in the case of this first embodiment according to the present invention, so far as the center magnetic field strength of 1.35 T, the effective magnetic field area Le having about ±55 mm can be attained. Namely, so far as a very strong magnetic fiel strength in which the center magnetic field strength is 1.35 T, a wide effective magnetic field are Le having about ±55 mm can be realized.

The reasons for maintaining such a wide effective magnetic field area Le having the above stated strong magnetic field strength are as follows. In the case of the electromagnet of this first embodiment according to the present invention, as shown in FIG. 4, at the left side between the magnetic poles, the magnetic field strength is strong and at the right side between the magnetic poles, the magnetic field strength is weak. Namely, in the right side area in the magnetic pole, the magnetic flux density is low.

Accordingly, in a case where the center magnetic field strength becomes strong, at the left side area in the magnetic pole the magnetic saturation occurs. However at the right side area in the magnetic pole since the magnetic flux density is low, there is no affect due to the magnetic saturation. Namely, at the left side and at the right side in the magnetic pole, since the balance of the magnetic flux density is largely different, the effective magnetic field area Le reduces largely. This is caused by a non-linear characteristic property of the magnetic saturation.

However, as shown in FIG. 1, in a case where plural spaces are provided mainly at the right side area in the magnetic pole, the magnetic flux at the right side area avoids a space where the magnetic resistance is large but can pass through the area where a relative permeability in the magnetic pole surrounding the space is large.

As a result, the magnetic flux density mainly at the right side area in the magnetic pole increases and the affect of the magnetic saturation appears in the right side magnetic pole. Namely, it is possible to make small the fall-in balance (the affect of the non-linear characteristic property of the magnetic saturation) of the magnetic flux density at the right side and at the left side in the magnetic pole. Accordingly, as shown in FIG. 2, the wide effective magnetic field area Le extending to the strong magnetic field strength can be realized.

In this first embodiment according to the present invention, since the projection of the magnetic pole shown in the conventional technique is unnecessary, the magnetic pole structure can be simplified. Further, since a high processing accuracy for the space which is provided in the magnetic pole is unnecessary, and also a manufacturing cost can be made cheaply.

As stated above, in this first embodiment according to the present invention, since the space is provided in the area in which the magnetic flux density is low relatively in the magnetic pole, the magnetic flux density at this area is increased and the magnetic saturation effect is obtained at a whole magnetic poles, therefore a predetermined effective magnetic field area can be realized.

Further, in this first embodiment according to the present invention, since the interval of the adjacent spaces is formed narrower toward the right side, the increase of the magnetic flux density at the right side area is performed more effectively.

Second Embodiment

Figure 5:
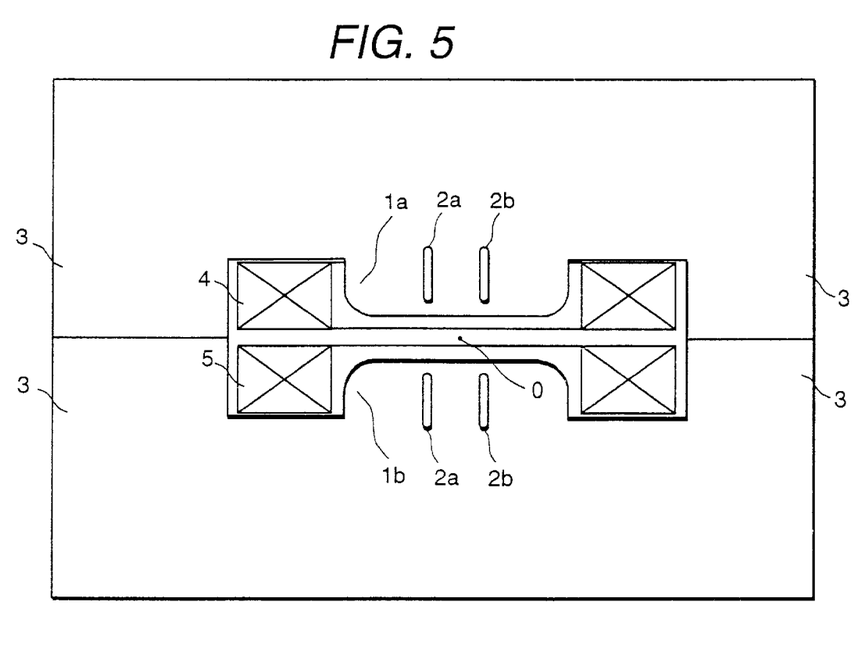
FIG. 5 is a longitudinal cross-sectional view showing a second embodiment of an electromagnet according to the present invention.

Next, a second embodiment of an electromagnet according to the present invention will be explained referring to FIG. 5. FIG. 5 is a longitudinal cross-sectional view showing a deflective electromagnet in which the present invention is applied. This electromagnet is assumed that the electromagnet is provided on an orbit of a circulating charged particle beam.

This electromagnet is comprised of a pair of magnetic pole 1a and magnetic pole 1b which are arranged oppositely by sandwiching the orbit of the charged particle beam, a return yoke 3 for forming a magnetic path by connecting the magnetic pole 1a and the magnetic pole 1b, and exciting coils 4 and 5, etc. In an interior portion of each of the magnetic pole 1a and the magnetic pole 1b, two spaces 2a and 2b are provided at an area near a surface of the magnetic pole arranged side by side in a horizontal direction (a lateral direction in FIG. 5). A horizontal direction position of the respective spaces 2a and 2b is about −40 mm and about +40 mm about a center O of the beam orbit.

A surface for opposing the magnetic pole 1a and the magnetic pole 1b of the second embodiment according to the present invention is constituted to have a different magnetic pole (n pole or S pole) from each other similarly to that of the first embodiment.

The upper and lower symmetric structure with respect to the orbit horizontal plane, an upper and lower division structure and a laminated steel plate structure of the electromagnet of the second embodiment according to the present invention are similar to those of the first embodiment according to the present invention.

The interior portion of each of the spaces 2a and 2b is an air layer and forms an area of a lower relative permeability than that of the magnetic pole forming material. Each of the space 2a and the space 2b is formed with a similar shape and a longitudinal cross-section of each of the space 2a and the space 2b is formed with a substantially rectangular shape or a lace orbit shape and also has a slot like shape with extends in a vertical direction against a paper face of FIG. 5.

Figure 6:
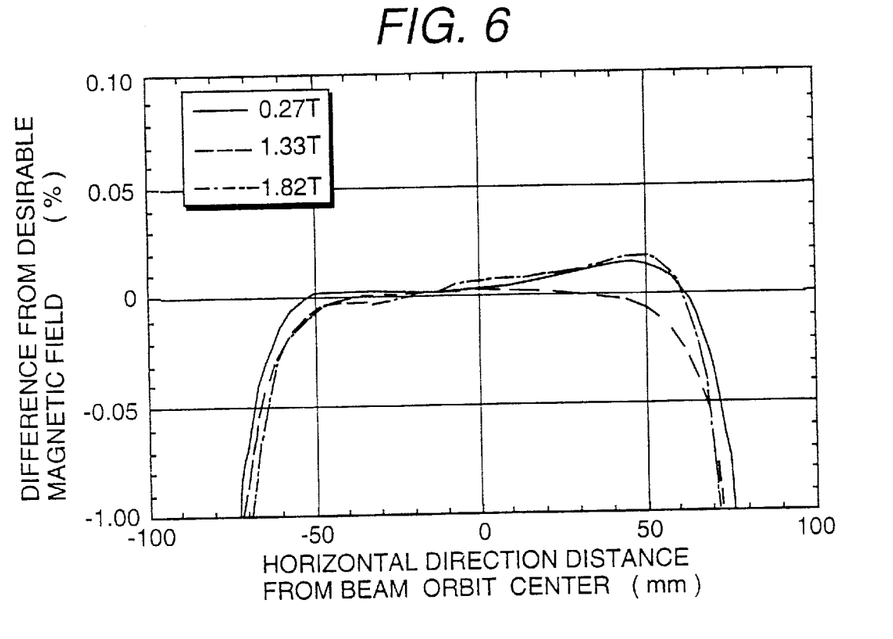
FIG. 6 is an analysis example showing a magnetic field distribution according to the second embodiment.

An improvement effect of the magnetic field distribution of this second embodiment according to the present invention will be explained referring to FIG. 6 and FIG. 7. FIG. 6 shows an analysis example of the second embodiment according to the present invention and FIG. 7 shows an analysis example of a second comparison example in which the spaces of FIG. 5 do not exist, respectively.

Figure 7:
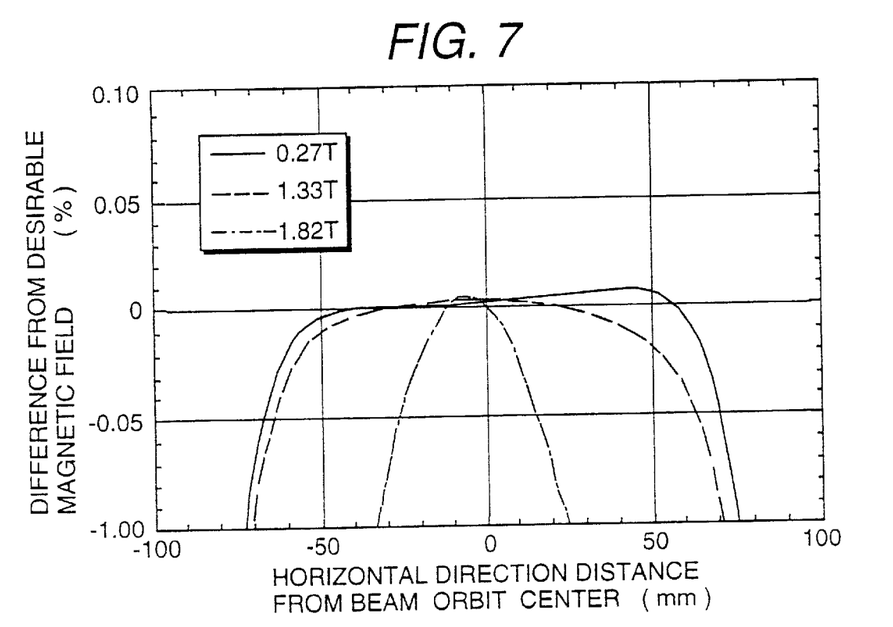
FIG. 7 is an analysis example showing a magnetic field distribution according to a second comparison example.

In both of FIG. 6 and FIG. 7, a horizontal axis expresses a horizontal direction distance from the center O of the beam orbit in FIG. 5 and a vertical axis expresses a relative value which is standardized by a difference between a required desirable magnetic field strength in the electromagnet of FIG. 5 and the desirable magnetic field strength.

The desirable magnetic field of this second embodiment according to the present invention is a uniform magnetic field distribution extending in the horizontal direction. In FIG. 6 and FIG. 7, a real line, a dot line and a one-dot chain line show cases where the center magnetic field strength is 0.27 T, 1.33 T and 1.82 T, respectively.

In a case of FIG. 7, at $B_0$=0.27 T, the effective magnetic field area Le is about ±60 mm; at $B_0$=1.33 T, Le is about ±50 mm; and at $B_0$=1.82 T, Le is about ±10 mm. Namely, between the center magnetic field strength from 1.33 T to 1.82 T, the effective magnetic field area Le reduces abruptly.

In comparison with the above case, in the case of this second embodiment according to the present invention, as shown in FIG. 6, so far as the center magnetic field strength of 1.82 T, the effective magnetic field area Le having about ±55 mm can be attained.

Namely, so far as a very strong magnetic field strength in which the center magnetic field strength is 1.82 T, a wide effective magnetic field area Le having about ±55 mm in the horizontal direction distance can be realized.

The reasons of the above stated facts are as following. In a case of FIG. 5, the magnetic flux density in the magnetic pole is high at a right and left end portion areas but is low at a central area. As shown in FIG. 5, when two spaces are provided at the area in which the magnetic flux density is comparatively high in comparison with the center of the magnetic pole, the magnetic flux density in the inner side area becomes higher than those of the spaces.

As a result, the substantially uniform magnetic flux density can be obtained in the interior portion of the magnetic pole. Accordingly, as shown in FIG. 6, the wide effective magnetic field area Le in which the strong magnetic field strength extends, namely the substantially uniform magnetic field area can be realized.

In this second embodiment according to the present invention, with the same reasons stated in the first embodiment according to the present invention, the magnetic pole structure can be simplified and the manufacturing cost can be made cheaply. Further, in this second embodiment according to the present invention, a punching-out die for the laminated electromagnetic steel plates can be simplified, it can be contributed to the cost reduction for the electromagnet.

As stated in above, according to this second embodiment of the present invention, since the spaces are provided in the area where the magnetic flux density in the magnetic pole is relatively high, the magnetic flux density of a surrounding area in the area where the spaces are provided is increased, therefore a predetermined effective magnetic field area can be realized.

Further, in the respective embodiments according to the present invention, in a case where the magnetic pole structure becomes a bit complicated, it can provide the conventional projection at the end portion of the magnetic pole. In this case, the insurance for the wide effective magnetic field area against the increase in the magnetic field strength can be attained more effectively. one, it can provide the conventional projection at the end portion of the magnetic pole. In this case, the insurance for the wide effective magnetic field area against the increase in the magnetic field strength can be attained more effectively.

Third Embodiment

Figure 8:
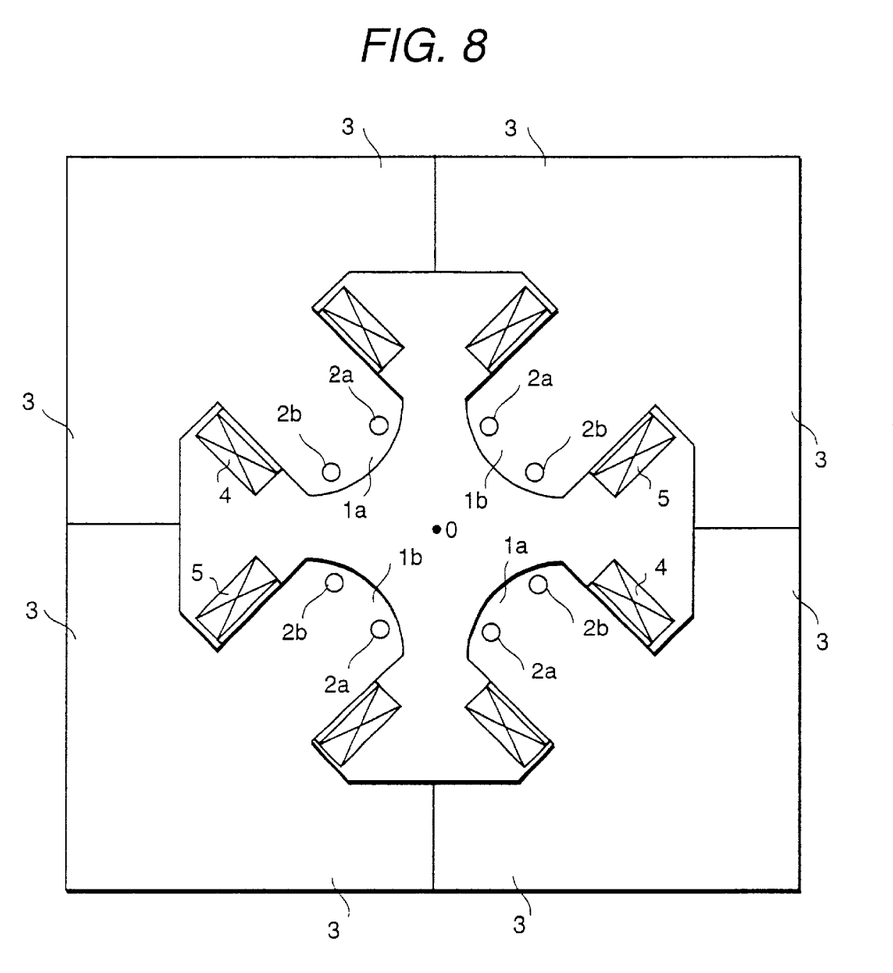
FIG. 8 is a longitudinal cross-sectional view showing a third embodiment of an electromagnet according to the present invention.

Next, a third embodiment according to the present invention will be explained referring to FIG. 8. FIG. 8 is a longitudinal cross-sectional view showing a quandrupole magnet in which the present invention is applied. This electromagnet is arranged such that the electromagnet is provided on an orbit of a circulating charged particle beam.

The electromagnet is comprised of two pairs of magnetic pole 1a and magnetic pole 1b which are arranged to be in point symmetry about a center O of the beam orbit of the charged particle beam, a return yoke 3 which forms a magnetic path by connecting adjacent magnetic poles with each other, and exciting coils 4 and 5, etc. In an interior portion of the magnetic pole 1a and the magnetic pole 1b, two spaces 2a and 2b are provided in an area surrounding the central portion of the magnetic pole at an area near to a surface of the magnetic pole.

The return yoke 3 is divided into an upper portion and a lower portion on a horizontal plane of the orbit and further divided into a right portion and a left portion against a vertical plane (herein an orbit vertical plane) including a center O of the beam orbit. Each of the four divided return yoke and each of the magnetic poles are formed with an integral structure and accordingly as shown in FIG. 8 four magnetic cores are constituted. Each of the magnetic cores is constituted by laminating thin plate like steel plates that are combined on the orbit horizontal plane and the orbit vertical plane.

The surface of the magnetic pole 1a and the surface of the magnetic pole 1b are formed to have a different magnetic pole (N pole or S pole) from each other. For example, when the surface of the magnetic pole 1a is N pole, the surface of the magnetic pole 1b is S pole, and an electric current direction for flowing into the exciting coils 4 and 5 is adjusted. As a result, N pole and S pole are arranged alternatively, and a quandrupole magnetic field is formed on the beam orbit.

An interior portion of each of the spaces 2a and 2b is an air layer and forms a lower relative permeability than that of the magnetic pole forming material. The spaces 2a and 2b have the same shape. A vertical cross-section shows a substantial circular perpendicular to the plane in which FIG. 8 lies, the space has a lengthwise extending column like shape.

In a case of this third embodiment according to the present invention, an interval formed adjacent magnetic poles is narrower toward an end portion of the magnetic pole, a magnetic field strength formed between the magnetic poles becomes stronger near an end portion of the magnetic pole. Namely, a magnetic flux in the magnetic pole becomes higher toward an end portion of an area.

As shown in FIG. 8, in a case that the space is provided at an area where the magnetic flux has a comparative high in comparison with that of a magnetic pole center, the magnetic flux having passed this space passes through a central area in the magnetic pole which exists toward an inner side from the space and where a magnetic resistance is low. As a result, the magnetic flux in the central area existed toward the inner side from the space increases.

Accordingly, in this third embodiment according to the present invention, similarly to that of the first embodiment according to the present invention, a wide effective magnetic field area having a strong magnetic field strength can be realized. However, in this third embodiment according to the present invention, the quandrupole magnetic pole component generated by the electromagnet is regulated according to a magnetic field gradient. Further, for the same reasons stated in the first embodiment according to the present invention, a magnetic pole structure can be simplified and also a manufacturing cost can be made cheaply.

As stated in the above, according to this third embodiment of the present invention, since the space is provided at the area where the magnetic flux in the magnetic pole is comparatively high, the magnetic flux of a surrounding area on which the space is provided is increased, a predetermined effective magnetic field area can be realizes.

Further, in the respective above stated embodiments according to the present invention, the space is provided at the area where the magnetic flux is comparatively high or the area where the magnetic flux is comparatively low, however in a case where the space is suitably provided at both areas, the similar effect can be obtained. Further, it is effective to provide the space at the area near the magnetic surface in the magnetic pole, further it is effective to arrange suitably more than two plural spaces.

Further, in place of the laminated electromagnetic steel plate, an iron block can be used in the magnetic pole and in this case the similar effect can be obtained. Further, in place of the space, it can provide an area where a lower relative permeability material than that of an iron system material for constituting the magnetic pole is filled up.

The above stated concepts can be applied to an electromagnet for generating a multi-pole magnetic field having more than a sexterpole electromagnet.

Fourth Embodiment

Figure 9:
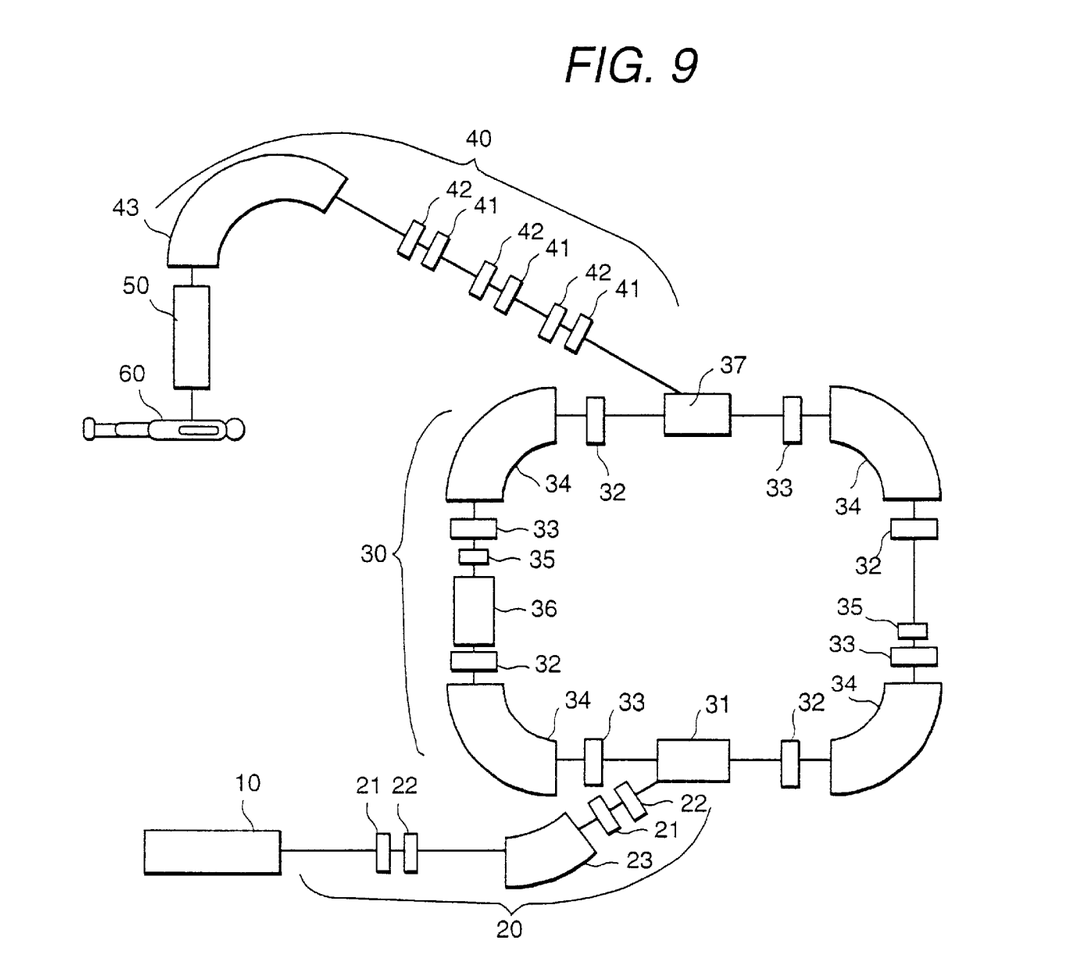
FIG. 9 is a schematic construction view showing a medical treatment use accelerator using an electromagnet of a fourth embodiment according to the present invention.

Next, a fourth embodiment of a medical treatment use accelerator system using the electromagnet according to the present invention will be explained referring to FIG. 9. FIG. 9 is a schematic construction view showing the medical treatment use accelerator system.

The medical treatment use accelerator system comprises a first half accelerator 10, a low energy beam transportation system 20, a synchrotron 30, a high energy beam transportation system 40, a beam irradiation means 50, a power supply means for supplying electricity to those means, and a control means (not shown in figure) for carrying out a respective control and a coordinated control for those means, etc.

The low energy beam transportation system 20 injects a beam having a low energy, which is extracted from the first half accelerator 10, to the synchrotron 30. The synchrotron 30 accelerates the injected beam having the low energy to a beam having a high energy. The high energy beam transportation system 40 transports the high energy beam extracted from the synchrotron 30 to the beam irradiation means 50. The beam irradiation means 50 radiates the high energy beam to an affected part of a patient 60 in an irradiation room (not shown in figure).

The low energy beam transportation system 20 comprises quandrupole electromagnets 21 and 22, and electromagnet 21 generates a magnetic field for focusing the beam to a horizontal direction and on the other hand the quandrupole electromagnet 22 generates a magnetic field for converging the beam to a vertical direction, for example. The bending electromagnet 23 deflects the beam in a horizontal plane.

The synchrotron 30 comprises an injecting device 31, quandrupole electromagnets 32 and 33, a bending electromagnet 34, a sexterpole electromagnet 35, a high frequency accelerating cavity 36, an extracting device 37, etc. The injecting device 31 injects a low energy beam extracted from the quandrupole electromagnet to the synchrotron 30.

The quandrupole electromagnet 32 generates a magnetic field for converging the beam to a horizontal direction and on the other hand the quandrupole electromagnet 33 generates a magnetic field for converging the beam to a vertical direction, for example. The bending electromagnet 34 deflects the beam in a horizontal plane (an orbit horizontal plane of a circulating beam).

The high frequency accelerating cavity 36 accelerates the beam by applying the high frequency magnetic field to the circulating beam. The extracting device 37 extracts from the synchrotron 30 a beam accelerated by the high frequency accelerating cavity 36. In this case, by applying the sexterpole magnetic field to the beam which circulates from the sexterpole electromagnet 35, accordingly the beam extraction is assisted.

The high energy beam transportation system 40 comprises a quandrupole electromagnets 41 and 42, and a bending electromagnet 43, etc. The quandrupole electromagnet 41 generates a magnetic field for converging the beam to a horizontal direction and on the other hand the quandrupole electromagnet 42 generates a magnetic field for converging the beam to a vertical direction, for example. The bending electromagnet 43 deflects the beam in a horizontal plane.

In this fourth embodiment according to the present invention, as the electromagnet for the low energy beam transportation system 20, a conventional electromagnet (a space does not exist in a magnetic pole) is employed, and as to the electromagnets for the synchrotron 30 and the high energy beam transportation system 40, the electromagnet (the space exists in the magnetic pole) according to the present invention is employed.

Namely, the electromagnet according to the present invention is employed to the quandrupole electromagnets 32 and 33 of the synchrotron 30, the bending electromagnet 34, the sexterpole electromagnet 35, the quandrupole electromagnets 41 and 42 for the high energy beam transportation system 40, and the bending electromagnet 43. For example, it can employ the electromagnet shown in FIG. 5 as the bending electromagnet and also it can employ the electromagnet shown in FIG. 8 as the quandrupole electromagnet.

In a case of this fourth embodiment according to the present invention, since the energy of the beam extracted from the first half accelerator 10 is low and is substantially constant, it is unnecessary to employ the electromagnet according to the present invention to the low energy beam transportation system 20. On the other hand, in the synchrotron 30, to accelerate the injected beam to an energy necessary for an irradiation medical treatment, it necessities a wide range center magnetic field strength, accordingly the electromagnet according to the present invention is employed.

Further, in the high energy beam transportation system 40, in a case where the energy range of the radiated beam from the synchrotron 30 is wide, namely so as to correspond to a case where the energy of the beam radiated from the synchrotron 30 varies over a short time and at every operation pulse, the electromagnet according to the present invention is employed.

The fourth embodiment of the present invention is applied to the electromagnets for the synchrotron 30 and the high energy beam transportation system 40. In a case where a necessary maximum beam energy is the same as that of the prior art, a small electromagnet can be formed as compared with that of the prior art, and a small size synchrotron 30 and high energy beam transportation system 40 can be realized. Namely, a medical treatment use accelerator system with a small size can be realized.

Further, in a case where the sizes of the electromagnets for the synchrotron 30 and the high energy beam transportation system 40 are same as those of the prior art, namely in a case where the sizes of the synchrotron 30 and the high energy beam transportation system 40 are the same as those of the prior art, the maximum magnetic field strength capable of being generated in the electromagnet is larger than that of the prior art. As a result, the maximum beam energy obtained for the irradiation medical treatment use can be heightened.

Further, in this fourth embodiment according to the present invention, for both of the electromagnets for the synchrotron 30 and the high energy beam transportation system 40, the electromagnet according to the present invention is employed. Also, for the case where only one of the electromagnets for the synchrotron 30 and the high energy beam transportation system 40, the electromagnet according to the present invention can be employed or in a case where only one of the bending electromagnet and the quandrupole electromagnet as the electromagnet according to the present invention can be employed, above stated effect can be obtained in comparison with that of the prior art.

Further, as shown in this fourth embodiment according to the present invention, the electromagnet according to the present invention is not limited to the medical treatment use accelerator in which the beam taken out from the synchrotron is utilized directly but also can apply to a general physical experimentation use accelerator and an industrial use accelerator, etc., and in those cases the similar effect can be obtained.

Further, the electromagnet according to the present invention can apply to the bending electromagnet, the quandrupole electromagnet and the sexterpole electromagnet and in addition to those it can apply to various electromagnets such as an octapole electromagnet, and a steering electromagnet, etc.

Fifth Embodiment

Figure 10A:
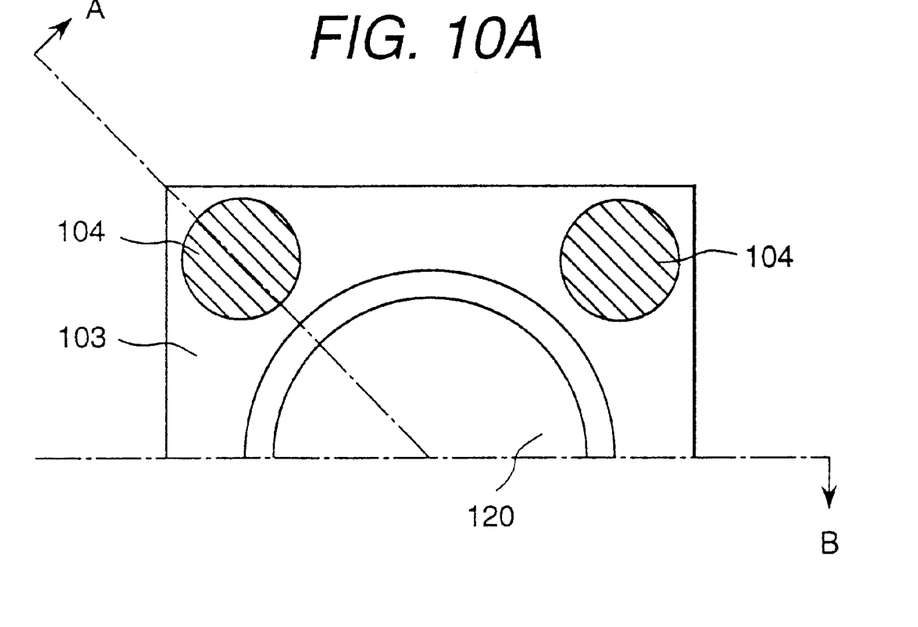
FIG. 10A is a longitudinal cross-sectional view showing an electromagnet of a fifth embodiment according to the present invention.
Figure 10B:
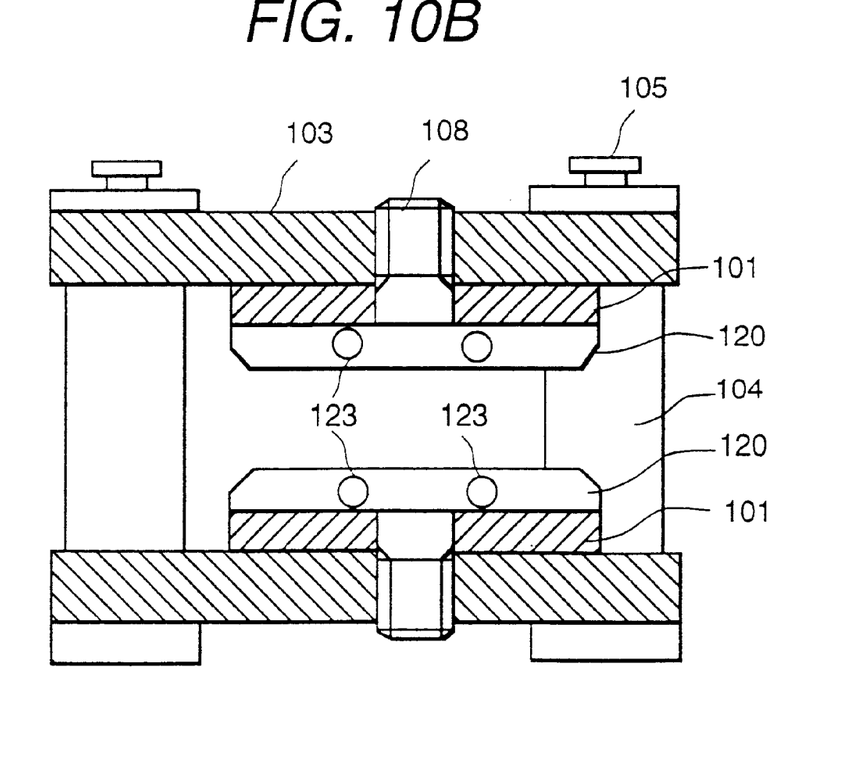
FIG. 10B is a lateral cross-sectional view showing the electromagnet of the fifth embodiment according to the present invention.

Next, an MRI (Magnetic Resonance Imager) as one embodiment of a magnetic field generating apparatus according to the present invention will be explained referring to FIG. 10A, FIG. 10B and FIG. 11. FIG. 10A and FIG. 10B are schematic construction views showing an MRI. FIG. 10A is a longitudinal cross-sectional view showing an MRI and FIG. 10B is a lateral cross-sectional view showing an MRI.

The MRI comprises a pair of permanent magnets 101 which are arranged oppositely by forming an air gap, a pair of pole pieces 120 which are provided at a side of the air gap of the permanent magnet 101, a toke 103 and four supporting stands 104 for combining magnetically the permanent magnet 101 and the pole piece 120, a permanent magnet fixing use bolt 108 for fixing the permanent magnet 101, and an adjusting use bolt which is provided on an upper portion of the four supporting stands 104 for adjusting a length of the above stated air gap. The pole piece 120 has spaces 123. Further, each of the toke 103 and the supporting stand 104 is made of a magnetic body.

Further, an upper portion magnetic pole portion of the MRI will be explained referring to FIG. 11. As shown in FIG. 11, the upper portion magnetic pole portion comprises the permanent magnet 101, the pole piece 120, the yoke 103 and the permanent magnet fixing use bolt 108.

Figure 11:
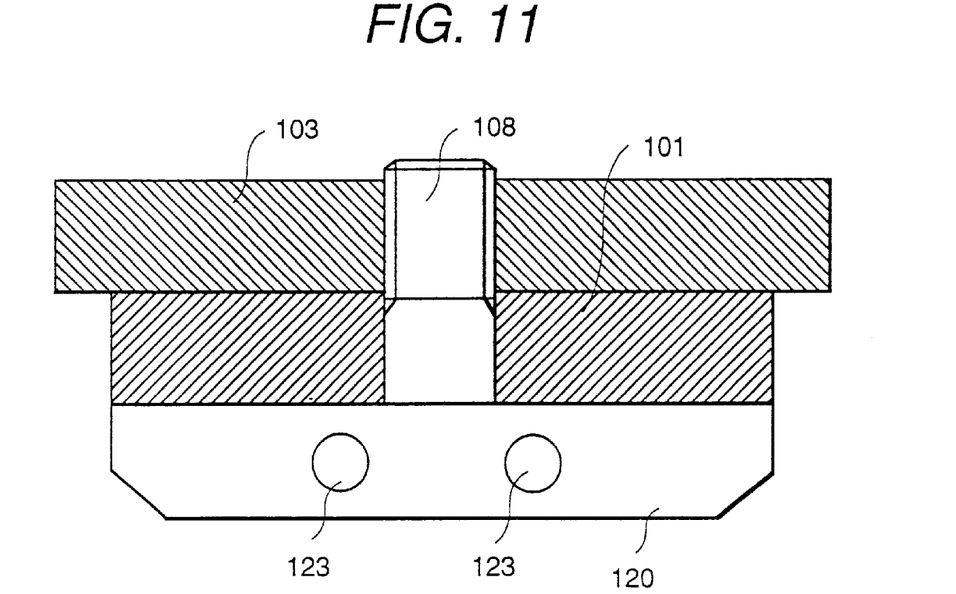
FIG. 11 is a lateral cross-sectional view showing an upper portion magnetic pole portion of the fifth embodiment.

In FIG. 11, all of the magnetic fields generated from the permanent magnet 101 are sucked in the pole piece 120 and the yoke 103, consequently the magnetic field generates from the pole piece 120 to the air gap. In this fifth embodiment according to the present invention, to avoid a magnetic field concentration, an end portion of the pole piece 120 is cur obliquely as shown in FIG. 11. In a case where the end portion is cut obliquely, in general since a leakage of the magnetic flux is large, a homogenous magnetic field area becomes narrow.

However, in this fifth embodiment according to the present invention, since the spaces 123 are provided in the pole piece 120, the magnetic field is distributed to pass through by avoiding the spaces 123, as a result, the magnetic flux of a center area flows to an end portion area where the cut is performed.

Accordingly, the magnetic field leakage at the end portion area is compensated and the homogenous magnetic field area is widened. Further, the effect obtained by this fifth embodiment according to the present invention is similar to the effect of the embodiment shown in FIG. 5.

Further, since the leakage magnetic field becomes larger by strengthening the magnetic field strength of the permanent magnet, the magnetic flux distribution can be controlled by bending the position of the spaces 123 to suit the maximum magnetic field strength to be used. As a result, at the pole piece 120 a magnetic saturation can be caused uniformly and a homogenous magnetic field area can be generated regardless of the magnetic strength.

As stated in the above, according to the fifth embodiment of the present invention, since the homogenous magnetic field area can be obtained with the wide range, the upper portion magnetic pole portion can form with a small size. Accordingly, MRI can form with a small size.

According to the present invention, since the area (the space) having the lower relative permeability compared with that of the magnetic pole forming material is provided in the magnetic pole of the electromagnet, with the simple magnetic pole structure, the wide effective magnetic field area can be secured even in a case where the maximum magnetic field strength is increased. Further, by applying the above stated electromagnet to the accelerator, the energy range of the beam capable for utilize can be widened with a small size accelerator.

Further, according to the present invention, since the area (the space) having the lower relative permeability compared with that of the pole piece forming material is provided in the pole piece of the magnetic field generating apparatus, with a simple pole piece structure, the high magnetic field and the uniformity property magnetic property can be secured.

What is claimed is:

1. An accelerator comprises a first accelerator for generating a charged particle beam, a synchrotron being a second accelerator for increasing an energy by accelerating said charged particle beam, and a beam transportation system which radiates said charged particle beam radiated from said first accelerator to said synchrotron; wherein said synchrotron has an electromagnet in which the magnetic pole incorporates a hollow space at the interior portion of the poles, thus providing a lower relative permeability as compared to the magnetic pole forming material.

2. An accelerator according to claim 1; wherein said area having said lower relative permeability is provided at an area which has a relatively high magnetic flux density at said interior portion of said magnetic pole.

3. An accelerator according to claim 1; wherein said area having said lower relative permeability is provided at an area which has a relatively low magnetic flux density at said interior portion of said magnetic pole.

4. An accelerator according to claim 1; wherein said synchrotron comprises:
  an extracting device for extracting said accelerated charged particle beam; and further
  a second beam transportation system for transporting said extracted charged particle beam which is radiated from said extracting crevice to a beam application equipment.

5. An accelerator according to claim 4; wherein said beam application equipment comprises a beam irradiation means for irradiating said charged particle beam to an affected part of a patient in an irradiation room.

6. An accelerator comprises a first accelerator for generating a charged particle beam, a synchrotron being a second accelerator for increasing an energy by accelerating said charged particle beam, and a beam transportation system which extracts said charged particle beam radiated from said first accelerator to said synchrotron; wherein said synchrotron has an electromagnet in which the magnetic pole incorporates a hollow space at the interior portion of the poles, thus providing a lower relative permeability as compared to the magnetic pole forming material.

* * * * *